(12) United States Patent
Imaizumi et al.

(10) Patent No.: US 9,876,377 B2
(45) Date of Patent: Jan. 23, 2018

(54) MULTICHIP, BATTERY PROTECTION APPARATUS, AND BATTERY PACK

(71) Applicants: Takashi Imaizumi, Tokyo (JP); Hiromichi Kaji, Tokyo (JP)

(72) Inventors: Takashi Imaizumi, Tokyo (JP); Hiromichi Kaji, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 82 days.

(21) Appl. No.: 15/214,548

(22) Filed: Jul. 20, 2016

(65) Prior Publication Data

US 2017/0033574 A1    Feb. 2, 2017

(30) Foreign Application Priority Data

Jul. 30, 2015   (JP) .................. 2015-150688

(51) Int. Cl.
*H02J 7/00*     (2006.01)
*H02H 3/20*    (2006.01)
*H02H 9/08*    (2006.01)
*H01M 10/42*  (2006.01)

(52) U.S. Cl.
CPC ......... *H02J 7/0072* (2013.01); *H01M 10/425* (2013.01); *H02J 7/0029* (2013.01); *H01L 2224/48137* (2013.01); *H01L 2224/48145* (2013.01); *H01L 2224/4911* (2013.01); *H01L 2224/49113* (2013.01); *H01M 2200/00* (2013.01); *H02J 2007/004* (2013.01); *H02J 2007/0037* (2013.01); *H02J 2007/0039* (2013.01); *H02J 2007/0096* (2013.01)

(58) Field of Classification Search
CPC ..... H02J 7/0072; H02J 7/0029; H01M 10/425
USPC .................... 320/112; 361/90, 93.9
See application file for complete search history.

(56) References Cited

U.S. PATENT DOCUMENTS 5,371,043 A * 12/1994 Anderson ........... H01L 23/3731
                                                            164/108
5,703,747 A * 12/1997 Voldman ............. H01L 23/5286
                                                            257/E23.153
8,760,827 B2 * 6/2014 Campi, Jr. .......... H01L 27/0274
                                                            361/111

(Continued)

FOREIGN PATENT DOCUMENTS

JP         2011-172458         9/2011

*Primary Examiner* — M'Baye Diao
(74) *Attorney, Agent, or Firm* — IPUSA, PLLC

(57) ABSTRACT

A multichip in which a protection IC for detecting at least one of overcharge, over discharge, and overcurrent of a secondary battery and a monitoring IC for monitoring a battery state of the secondary battery are integrated in a package. The protection IC and the monitoring IC are not overlapped in a plan view. A regulator output terminal for the monitoring IC, a ground terminal common to the protection IC and the monitoring IC, a power supply terminal common to the protection IC and the monitoring IC, and a current detection terminal for the protection IC are disposed along a first side of package, and a communication terminal for the monitoring IC, a discharge control terminal for the protection IC, a charge control terminal for the protection IC, and a overcurrent detection terminal for the protection IC are disposed as external connection terminals along the second side of package.

11 Claims, 11 Drawing Sheets

(56) References Cited

U.S. PATENT DOCUMENTS

2012/0300351 A1    11/2012  Ikeuchi et al.
2014/0354238 A1*   12/2014  Moreno ................ H02H 3/006
                                                    320/134

* cited by examiner

MULTICHIP, BATTERY PROTECTION APPARATUS, AND BATTERY PACK

CROSS-REFERENCE TO RELATED APPLICATIONS

This patent application is based upon and claims the benefit of priority of Japanese Patent Application No. 2015-150688, filed on Jul. 30, 2015, the entire contents of which are incorporated herein by reference.

BACKGROUND OF THE INVENTION

1. Field of the Invention

The present disclosure relates to multichip, battery protection apparatuses, and battery packs.

2. Description of the Related Art

Conventionally, a protection monitoring circuit is known, which includes a protection IC for performing monitoring operation by which charge or discharge operation of a secondary battery is prevented and a monitoring IC for monitoring a battery state of the secondary battery (e.g., Patent Document 1).

An external terminal needs to be provided in a multichip, in which the protection IC and the monitoring IC are integrated as a package. For example, the protection IC can detect a state outside the package (e.g., current flowing through secondary battery) via a detection terminal that is disposed as the external terminal. Also, when an external terminal for connecting an internal node of the monitoring IC and an external device is provided, the internal node can be accessed from outside the package to conduct a test.

However, if an external terminal dedicated for accessing the internal node of the monitoring IC from outside the package is provided, a total number of external terminals increases.

RELATED ART DOCUMENT

Patent Document

[Patent Document 1]: Japanese Laid-open Patent Publication No. 2011-172458

SUMMARY OF THE INVENTION

An object of present disclosure is to provide a multichip, a battery protection apparatus, and a battery pack, with which a total number of external terminals can be suppressed even if an external terminal for accessing the internal node of the monitoring IC is disposed.

According to one embodiment of the present invention, there is provided a multichip in which a protection IC for detecting at least one of overcharge, over discharge, and overcurrent of a secondary battery and a monitoring IC for monitoring a battery state of the secondary battery are integrated in a package, wherein the protection IC and the monitoring IC are disposed in a manner such that the protection IC and the monitoring IC are not overlapped in a plan view, the package is formed in a rectangular shape including a first side and a second side opposite the first side, a regulator output terminal for the monitoring IC, a ground terminal common to the protection IC and the monitoring IC, a power supply terminal common to the protection IC and the monitoring IC, and a current detection terminal for the protection IC are disposed along a first side of the package, and a communication terminal for the monitoring IC, a discharge control terminal for the protection IC, a charge control terminal for the protection IC, and a overcurrent detection terminal for the protection IC are disposed as external connection terminals along the second side of the package, the protection IC comprising, a charge control circuit configured to output a charge control signal at the charge control terminal based on at least one of a voltage between the power supply terminal and the ground terminal and a voltage between the current detection terminal and the ground terminal, a charge operation of the secondary battery being prevented by the charge control signal, and a discharge control circuit configured to output a discharge control signal at the discharge control terminal based on at least one of the voltage between the power supply terminal and the ground terminal and the voltage between the overcurrent detection terminal and the ground terminal, a discharge operation of the secondary battery being prevented by the discharge control signal, the monitoring IC comprising, a measuring circuit configured to measure at least one of a voltage of the secondary battery and a temperature of the monitoring IC, a communication circuit configured to transmit a measuring result of the measuring circuit via the communication terminal, a regulator outputting a voltage at the regulator terminal. The multichip comprises a selection circuit configured to perform a switching operation in which a plurality of nodes included in the monitoring IC are electively connected with the current detection terminal.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

In the following, embodiments of the present disclosure will be described with reference to accompanying drawings.

Figure 1:
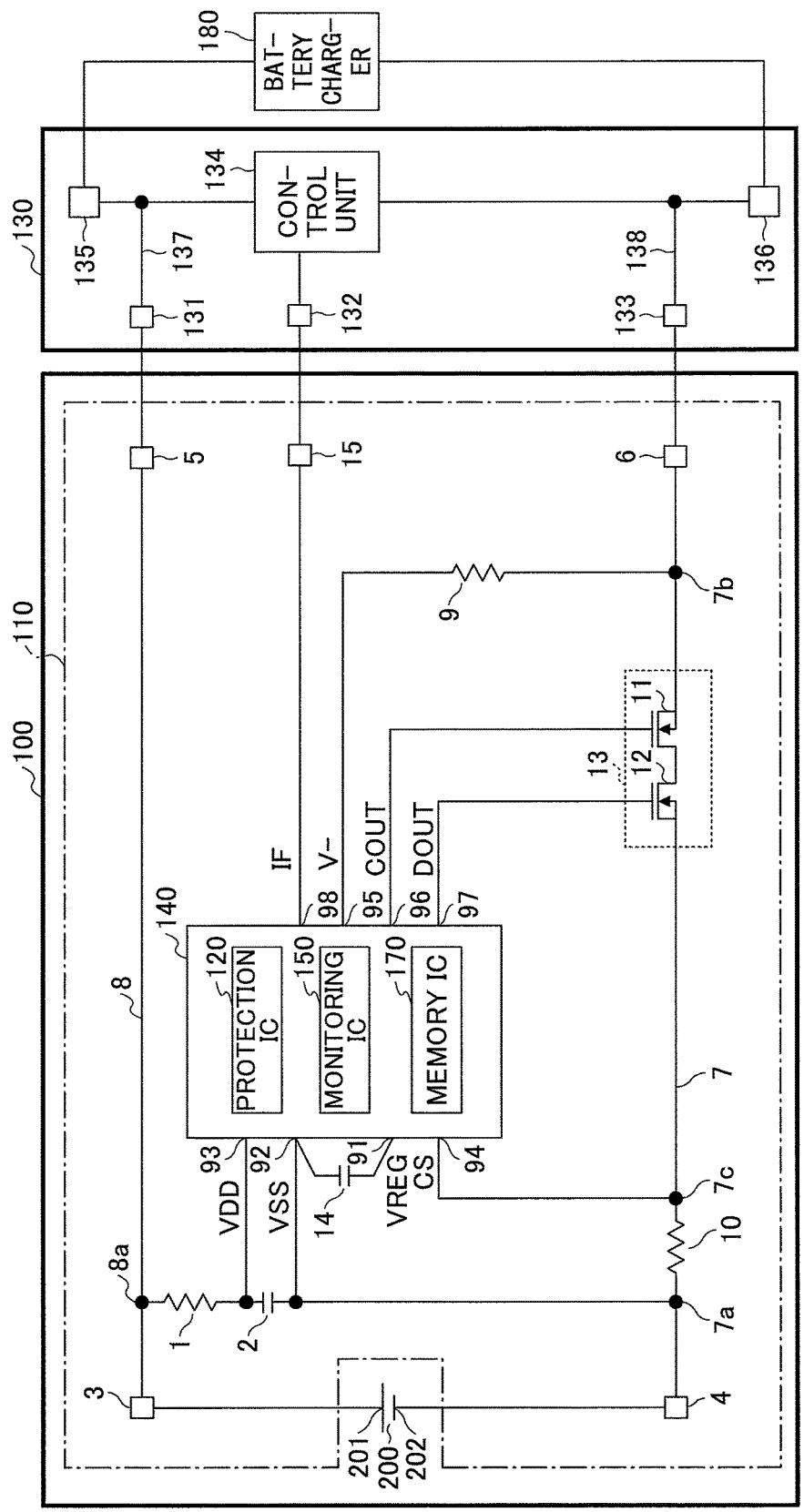
FIG. 1 is a diagram illustrating an example configuration of a battery pack including a multichip.

FIG. 1 is a diagram illustrating an example configuration of a battery pack 100 including a multichip 140. The battery pack 100 includes a secondary battery 200 for powering an electronic apparatus 130 coupled to a positive terminal 5 and a negative terminal 6 and a battery protection apparatus 110 for protecting the secondary battery 200. The battery pack 100 may be included in the electronic apparatus 130, or may be externally attached to the electronic apparatus 130.

The electronic apparatus 130 is an example load powered by the secondary battery 200 of the battery pack 100. A mobile terminal apparatus can be exemplified as the electronic apparatus 130. Electronic apparatuses, such as a mobile phone, a smartphone, a tablet computer, a game device, a television set, a sound/image player, and a camera, are included in the mobile terminal apparatus.

A lithium ion battery and a lithium polymer battery can be exemplified as the secondary battery 200.

The battery protection apparatus 110 that is powered by the secondary battery 200 is an example apparatus for battery, which protects the secondary battery 200 from overcurrent, etc., by controlling charge/discharge operation of the secondary battery 200. The battery protection apparatus 110 includes a positive electrode connection terminal 3, a negative electrode connection terminal 4, a positive terminal 5, a negative terminal 6, a communication terminal 15, a resistor 1, a capacitor 2, a capacitor 14, a resistor 9, a sense resistor 10, a switch circuit 13, and a multichip 140.

The positive electrode connection terminal 3 is coupled to the positive electrode 201 of the secondary battery 200, while the negative electrode connection terminal 4 is coupled to the negative electrode 202 of the secondary battery 200. The positive terminal 5, which is an example terminal coupled to an apparatus positive terminal 131 of the electronic apparatus 130, is connected to an apparatus power supply path 137 of the electronic apparatus 130 via the apparatus positive terminal 131. The negative terminal 6, which is an example terminal coupled to an apparatus negative terminal 133 of the electronic apparatus 130, is connected to an apparatus ground 138 of the electronic apparatus 130 via the apparatus negative terminal 133. The communication terminal 15, which is an example terminal coupled to the apparatus communication terminal 132 of the electronic apparatus 130, is connected to a control unit 134 of the electronic apparatus 130 via the apparatus communication terminal 132.

The electronic apparatus 130 includes a charge positive terminal 135 coupled to the apparatus power supply path 137 and a charge negative terminal 136 coupled to the apparatus ground 138. A battery charger 180 capable of charging the secondary battery 200 is coupled to the charge positive terminal 135 and the charge negative terminal 136.

The positive electrode connection terminal 3 and the positive terminal 5 are connected through a positive side power supply path 8, while the negative electrode connection terminal 4 and the negative terminal 6 are connected through a negative side power supply path 7. The positive side power supply path 8 is an example charge/discharge path between the positive electrode connection terminal 3 and the positive terminal 5. The negative side power supply path 7 is an example charge/discharge path between the negative electrode connection terminal 4 and the negative terminal 6.

The switch circuit 13 is connected in series with the negative side power supply path 7 formed between a first negative side power supply path 7a and a second negative side power supply path 7b. For example, the switch circuit 13 is a series circuit, in which a charge control transistor 11 and a discharge control transistor 12 are connected in series. In response to turning off the charge control transistor 11, the negative side power supply path 7 through which charge current of the secondary battery 200 flows is shut off, thereby preventing charge current flow in the secondary battery 200. In response to turning off the discharge control transistor 12, the negative side power supply path 7 through which discharge current of the secondary battery 200 flows is shut off, thereby preventing discharge current flow in the secondary battery 200.

For example, the charge control transistor 11 and the discharge control transistor 12 are respectively MOSFETs (Metal Oxide Semiconductor Field Effect Transistor). The charge control transistor 11 is disposed in the negative side power supply path 7, where a forward direction of a parasitic diode in the charge control transistor 11 coincides with a discharge direction of the secondary battery 200. The discharge control transistor 12 is disposed in the negative side power supply path 7, where a forward direction of a parasitic diode in the discharge control transistor 12 coincides with a charge direction of the secondary battery 200.

By connecting the switch circuit 13 with the negative side power supply path 7 in series, size of the discharge control transistor 12 and the charge control transistor 11 in the switch circuit 13 can be reduced in comparison to a case where the switch circuit 13 is connected in series with the positive side power supply path 8.

The multichip 140 is an example circuit for battery that protects the secondary battery 200 from overcurrent, etc., by controlling charge/discharge of the secondary battery 200. The multichip 140 includes a power supply terminal 93, a ground terminal 92, a regulator output terminal 91, a current detection terminal 94, a discharge control output terminal 97, a charge control output terminal 96, a overcurrent detection terminal 95, and a communication terminal 98.

The power supply terminal 93 is an example power supply terminal common to a protection IC 120 and a monitoring IC 150, and the power supply terminal 93 is at a power supply potential common to the protection IC 120 and the monitoring IC 150. The power supply terminal 93 is a positive side power supply terminal coupled to a positive terminal 201 of the secondary battery 200 via a positive side connection point 8a and the positive electrode connection terminal 3, and may be referred to as a VDD terminal. For example, the power supply terminal 93 is connected with a connection point at which one end of the resistor 1 and one end of a capacitor 2 is connected, where the other end of the resistor 1 is connected to the positive side power supply path 8, and the other end of the capacitor 2 is connected to the negative side power supply path 7. The other end of the capacitor 2 is connected with the negative side power supply path 7 at a first negative side connection point 7a, where the negative side power supply path 7 is disposed between the negative electrode connection terminal 4 and the sense resistor 10.

The ground terminal 92 is an example ground terminal common to the protection IC 120 and the monitoring IC 150, and the ground terminal 92 is at a ground potential common to the protection IC 120 and the monitoring IC 150. The ground terminal 92 is a negative side power supply terminal coupled to a negative electrode 202 of the secondary battery 200 via the first negative side connection point 7a and the negative electrode connection terminal 4, and may be referred to as a VSS terminal. The ground terminal 92 is connected with the negative side power supply path 7 at the first negative side connection point 7a, and coupled to a source of the discharge control transistor 12 via the sense resistor 10.

The regulator output terminal 91 is an example regulator output terminal used for the monitoring IC 150. An output voltage of a regulator 158 (see FIG. 2) mounted on the monitoring IC 150 is output at the regulator output terminal 91, and the regulator output terminal 91 may be referred to as VREG terminal. On end of a capacitor 14 is coupled to the regulator output terminal 91, while the other end thereof is coupled to the ground terminal 92. The capacitor 14 is an element for stabilizing an output voltage of the regulator 158.

The discharge control output terminal 97 is an example discharge control output terminal used for the protection IC 120. A discharge control signal for controlling enable/disable of discharge of the secondary battery 200 is output at the discharge control output terminal 97, and the discharge control output terminal 97 may be referred to as DOUT terminal. The discharge control output terminal 97 is coupled to a control electrode (e.g., gate in MOSFET) of the discharge control transistor 12.

The charge control output terminal 96 is an example charge control output terminal used for the protection IC 120. A charge control signal for controlling enable/disable of charge of the secondary battery 200 is output at the charge control output terminal 96, and the charge control output terminal 96 may be referred to as COUT terminal. The charge control output terminal 96 is coupled to a control electrode (e.g., gate in MOSFET) of the charge control transistor 11.

The overcurrent detection terminal 95 is an example overcurrent detection terminal used for the protection IC 120. The overcurrent detection terminal 95 is coupled to the negative terminal 6 that is coupled to an apparatus ground 139 of the electronic apparatus 130, and may be referred to as a V− terminal. The overcurrent detection terminal 95 is connected with the negative side power supply path 7 at a second negative side connection point 7b via a resistor 9, where the negative side power supply path 7 is formed between the negative terminal 6 and the charge control transistor 11. The overcurrent detection terminal 95 is coupled to a source of the charge control transistor 11 via the resistor 9.

The current detection terminal 94 is an example current detection terminal used for the protection IC 120. The current detection terminal 94 is connected with the negative side power supply path 7 at a third negative side connection point 7c opposite the first negative side connection point 7a, and may be referred to as CS terminal. The sense resistor 10 is a current detection resistor connected in series with the negative side power supply path 7. One end of the sense resistor 10 is connected to the negative electrode 202 of the secondary battery 200 and the ground terminal 92 via the first negative side connection point 7a, while the other end of the sense resistor 10 is connected to the source of the discharge control transistor 12 and the current detection terminal 94 via the third negative side connection point 7c.

The communication terminal 98 is an example communication terminal used for the monitoring IC 150. The communication terminal 98 is connected to a communication circuit 162 (see FIG. 2) mounted on the monitoring IC 150, and may be referred to as an IF terminal. The communication terminal 98 is coupled to the communication terminal 15.

The multichip 140 includes the protection IC 120, the monitoring IC 150 and a memory IC 170.

The protection IC 120 that is powered by the secondary battery 200 is an example protection IC for protecting the secondary battery 200 from overcurrent, etc., by turning off the switch circuit 13 connected in series with the negative side power supply path 7 that is connected to the negative electrode 202 of the secondary battery 200. The protection IC 120 is an IC chip for protecting the secondary battery 200 from overcurrent, etc., by controlling charge/discharge of the secondary battery 200 through the switch circuit 13. The protection IC 120 that is powered by the secondary battery 200 protects the secondary battery 200. The protection IC 120 performs a protection operation for preventing charge or discharge of the secondary battery 200 by turning off the switch circuit 13.

Figure 2:
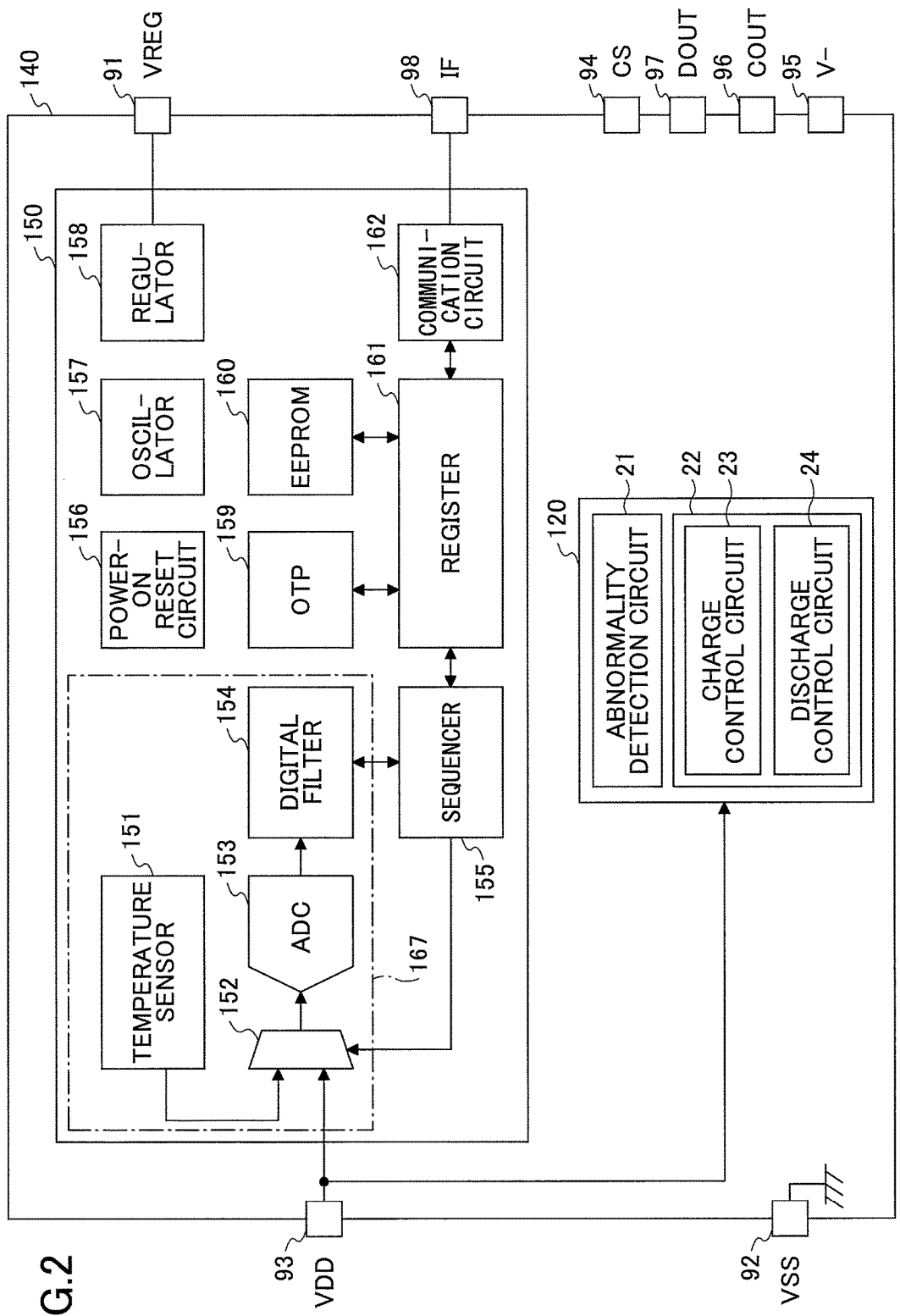
FIG. 2 is an example configuration of the multichip.

FIG. 2 is an example configuration of the multichip 140. The 120 includes an abnormality detection circuit 21 and a protection control circuit 22. The abnormality detection circuit 21 is an example unit for detecting abnormality of current or voltage in the secondary battery 200. The protection control circuit 22 controls the turning on/off of the charge control transistor 11 and discharge control transistor 12 by outputting a control signal for controlling the switching operation of the switch circuit 13 based on the abnormality detection result of the abnormality detection circuit 21.

For example, the protection control circuit 22 includes a charge control circuit 23 for performing an operation (overcharge protection operation) for protecting the secondary battery 200 from overcharge by controlling the charge control transistor 11. For example, the abnormality detection circuit 21 detects a battery voltage (cell voltage) of the secondary battery 200 by detecting a voltage between the power supply terminal 93 and the ground terminal 92. By detecting the cell voltage greater than or equal to a predetermined overcharge detection voltage Vdet1, the abnormality detection circuit 21 outputs an overcharge detection signal indicating that the overcharge of the secondary battery 200 is detected.

In response to detecting the overcharge detection signal, an overcharge control circuit 23 of the protection control circuit 22 waits until a predetermined overcharge detection delay time tVdet1 passes, then performs the overcharge protection operation in which a charge control signal COUT at a low level for turning off the charge control transistor 11 is output from the charge control output terminal 96. When the charge control transistor 11 is turned off, charge of the secondary battery 200 is prevented regardless of on/off state of the discharge control transistor 12, thereby preventing the overcharge of the secondary battery 200.

For example, the protection control circuit 22 includes a discharge control circuit 24 for performing an operation (over discharge protection operation) for protecting the secondary battery 200 from over discharge by controlling the discharge control transistor 12. For example, the abnormality detection circuit 21 detects a battery voltage (cell voltage) of the secondary battery 200 by detecting a voltage between the power supply terminal 93 and the ground terminal 92. In response to detecting the cell voltage equal to or less than a predetermined over discharge detection voltage Vdet2, the abnormality detection circuit 21 outputs an over discharge detection signal indicating that the over discharge of the secondary battery 200 is detected.

In response to detecting the over discharge detection signal, an over discharge control circuit 24 of the protection control circuit 22 waits until a predetermined over discharge detection delay time tVdet2 passes, then performs the overcharge protection operation in which a charge control signal DOUT at a low level for turning off the discharge control transistor 12 is output from the discharge control output terminal 97. When the discharge control transistor 12 is turned off, discharge of the secondary battery 200 is prevented regardless of on/off state of the charge control transistor 11, thereby preventing the over discharge of the secondary battery 200.

For example, the protection control circuit 22 includes the discharge control circuit 24 for performing an operation (discharge overcurrent protection operation) for protecting the secondary battery 200 from discharge overcurrent by controlling the discharge control transistor 12. For example, the abnormality detection circuit 21 detects a sense voltage between the charge control output terminal 96 and the ground terminal 92 caused by current flowing through the sense resistor 10. By detecting the sense voltage greater than or equal to a predetermined discharge overcurrent detection voltage Vdet3, the abnormality detection circuit 21 outputs an discharge overcurrent detection signal indicating that discharge overcurrent is detected, where the discharge over current is abnormal current flowing through the negative side power supply path 7 in a discharge direction of the secondary battery 200.

In response to detecting the discharge overcurrent detection signal, the discharge control circuit 24 of the protection control circuit 22 waits until a predetermined discharge overcurrent detection delay time tVdet3, then the discharge control circuit 24 performs the discharge overcurrent protection operation in which a discharge control signal DOUT at the low level for turning off the discharge control transistor 12 is output form the discharge control output terminal 97. When the discharge control transistor 12 is turned off, discharge of the secondary battery 200 is prevented regardless of on/off state of the charge control transistor 11, thereby preventing the overcurrent flowing in the discharge direction of the secondary battery 200.

For example, the protection control circuit 22 includes a charge control circuit 23 for performing an operation (charge overcurrent protection operation) for protecting the secondary battery 200 from charge overcurrent by controlling the charge control transistor 11. For example, the abnormality detection circuit 21 detects a sense voltage between the charge control output terminal 96 and the ground terminal 92 caused by current flowing through the sense resistor 10. In response to detecting the sense voltage equal to or less than a predetermined charge overcurrent detection voltage Vdet4, the abnormality detection circuit 21 outputs a charge overcurrent detection signal indicating that the charge overcurrent is detected, where the charge over current is abnormal current flowing through the negative side power supply path 7 in a charge direction of the secondary battery 200.

In response to detecting the charge overcurrent detection signal, the charge control circuit 23 of the protection control circuit 22 waits until a predetermined charge overcurrent detection delay time tVdet4, then the charge control circuit 23 performs the charge overcurrent protection operation in which a charge control signal COUT at the low level for turning off the charge control transistor 11 is output form the charge control output terminal 96. When the charge control transistor 11 is turned off, charge of the secondary battery 200 is prevented regardless of on/off state of the discharge control transistor 12, thereby preventing the overcurrent flowing in the charge direction of the secondary battery 200.

For example, the protection control circuit 22 includes the discharge control circuit 24 for performing an operation (short-circuiting protecting operation) for protecting the secondary battery 200 from short-circuiting current by controlling the discharge control transistor 12. For example, the abnormality detection circuit 21 detects a voltage P− between the negative terminal 6 and the negative electrode connection terminal 4 by detecting the voltage between the overcurrent detection terminal 95 and the ground terminal 92. In response to detecting the voltage P− greater than or equal to a predetermined short circuiting voltage Vshort, the abnormality detection circuit 21 outputs a short-circuiting detection signal indicating that a short-circuiting abnormality (short-circuiting overcurrent) between the positive terminal 5 and the negative terminal 6 is detected.

In response to detecting the short-circuiting detection signal, the discharge control circuit 24 of the protection control circuit 22 performs the short-circuiting protection operation in which the discharge control signal DOUT at the low level for turning off the discharge control transistor 12 is output from the discharge control output terminal 97. When the discharge control transistor 12 is turned off, discharge of the secondary battery 200 is prevented regardless of on/off state of the charge control transistor 11, thereby preventing the short-circuiting current flowing in the discharge direction of the secondary battery 200.

The monitoring IC 150, which is powered by the secondary battery 200, is an example monitoring IC for monitoring a battery state of the secondary battery 200. For example, the monitoring IC 150 is an IC chip for detecting at least one of a voltage, a current, a temperature, and a residual capacity of the secondary battery 200 as the battery state.

The monitoring IC 150 includes a measuring circuit 167 and the communication circuit 162. The measuring circuit 167 includes a multiplexer 152, an Analog to Digital Converter (ADC) 153, a digital filter 154. The measuring circuit 167 may include a temperature sensor 151. The temperature sensor 151 measures a temperature inside the monitoring IC 150.

The measuring circuit 167 is an example circuit for measuring the battery voltage (cell voltage) of the secondary battery 200. For example, the measuring circuit 167 measures the battery voltage of the secondary battery 200 by detecting a power supply voltage between the power supply terminal 93 and the ground terminal 92. When the ground terminal 92 is connected to the negative side power supply path 7 at a position between the negative electrode 202 and the switch circuit 13, a voltage drop due to a parasitic resistance of the switch circuit 13 is excluded from the battery voltage measured by the measuring circuit 167. In particular, when the ground terminal 92 is connected to the negative side power supply path 7 at a position between the negative electrode 202 and the sense resistor 10, a voltage drop due to the resistance of the sense resistor 10 can be also excluded from the battery voltage measured by the measuring circuit 167.

The communication circuit 162 is an example communication circuit for transmitting a measuring result of the measuring circuit 167 to an external device outside the multichip 140 via the communication terminal 98. The communication terminal 98 is coupled to the external communication terminal 15, where the external communication terminal 15 is connected to the electronic apparatus 130. Therefore, the communication circuit 162 can transmit the measuring result of the measuring circuit 167 to the electronic apparatus 130. The communication circuit 162 may transmit the result to the electronic apparatus 130 via the protection IC 120.

The monitoring IC 150 includes a temperature sensor 151, a multiplexer 152, an ADC 153, a digital filter 154, a sequencer 155, a power-on reset circuit 156, an oscillator 157, a regulator 158, an OTP 159, an EEPROM 160, a register 161, and a communication circuit 162.

The multiplexer 152 is a selection circuit for selectively switching the sensor voltage supplied from the temperature sensor 151 and the power supply voltage at the power supply terminal 93 by using the sequencer 155 to output the selected voltage to the ADC 153. The temperature sensor 151 measures the temperature inside the monitoring IC 150 to output a sensor voltage corresponding to the measured temperature. The sequencer 155 periodically performs AD conversion of the power supply voltage at the power supply terminal 93 and AD conversion of the sensor voltage provided from the temperature sensor 151 by using the ADC 153 without any instruction from an external device. The power supply voltage and the sensor voltage output from the ADC 153 is input to the sequencer 155 through a filtering process of the digital filter 154.

The sequencer 155 calculates the battery voltage of the secondary battery 200 based on the power supply voltage (on which filtering process of digital filter 154 has been performed) output from the ADC 153, and the calculated value is stored in the register 161. Also, the sequencer 155 calculates the temperature inside the monitoring IC 150 based on the sensor voltage (on which filtering process of digital filter 154 has been performed) output from the ADC 153, and the calculated value is stored in the register 161.

The sequencer 155 may corrects the calculated value of the battery voltage of the secondary battery 200 according to the calculated value of the temperature inside the monitoring IC 150, and the corrected value may be stored in the register 161. The communication circuit 162 serves as an interface for transmitting, via the communication terminal 98, information indicative of abnormality to the control unit 134 of the electronic apparatus 130 that is a host apparatus in a case where the corrected value of the battery voltage is abnormal.

Figure 3:
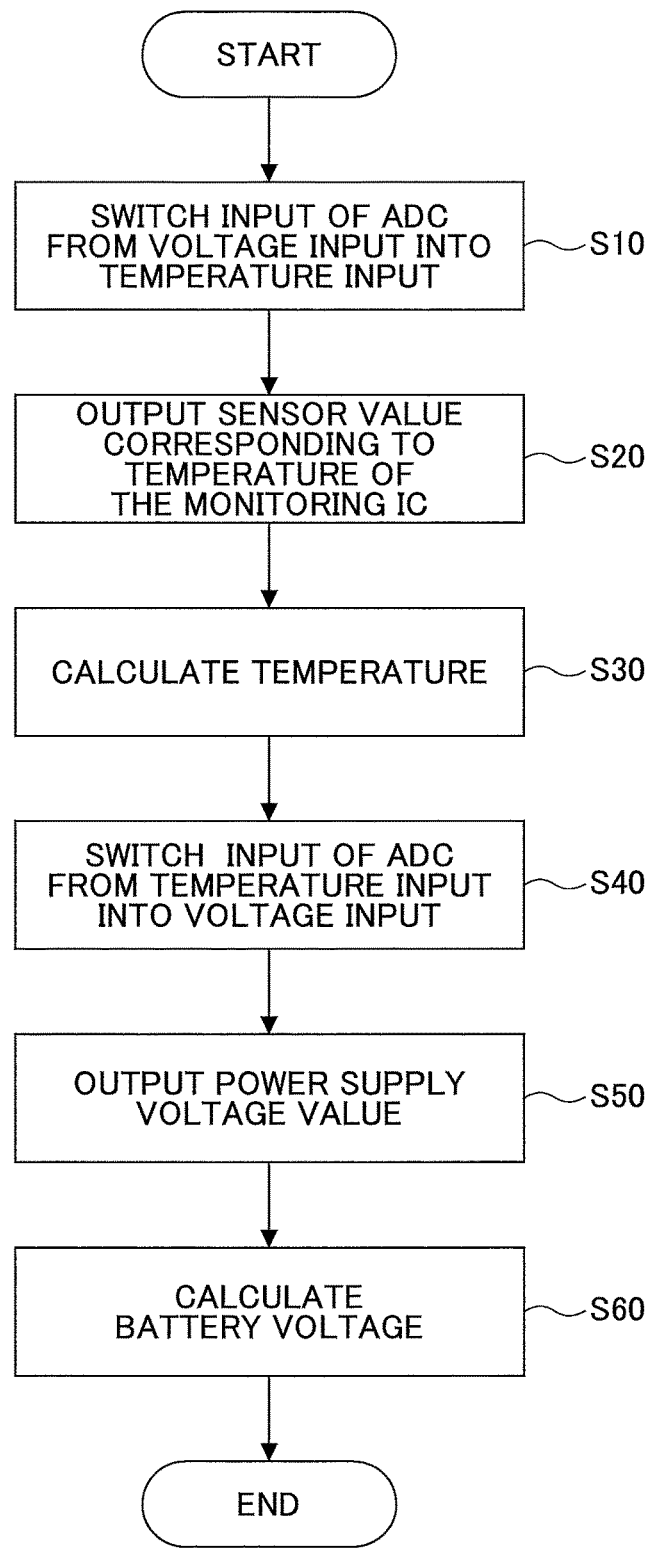
FIG. 3 is a flowchart illustrating an example operation of the sequencer.

FIG. 3 is a flowchart illustrating an example operation of the sequencer 155. The sequencer 155 starts the operation upon the power-on reset circuit 156 releasing reset. The sequencer 155 switches the input of the ADC 153 from voltage input into temperature input (step S10). The ADC 153 outputs the sensor voltage value corresponding to the temperature of the monitoring IC 150 (step S20), and the sequencer 155 calculates the temperature of the monitoring IC 150 based on the sensor voltage value (step S30). The sequencer 155 switches the input of the ADC 153 from the temperature input into the voltage input (step S40). The ADC 153 outputs the power supply voltage value (step S50), and the sequencer 155 calculates the battery voltage of the secondary battery 200 based on the power supply voltage (cell voltage) value (step S60).

Figure 4:
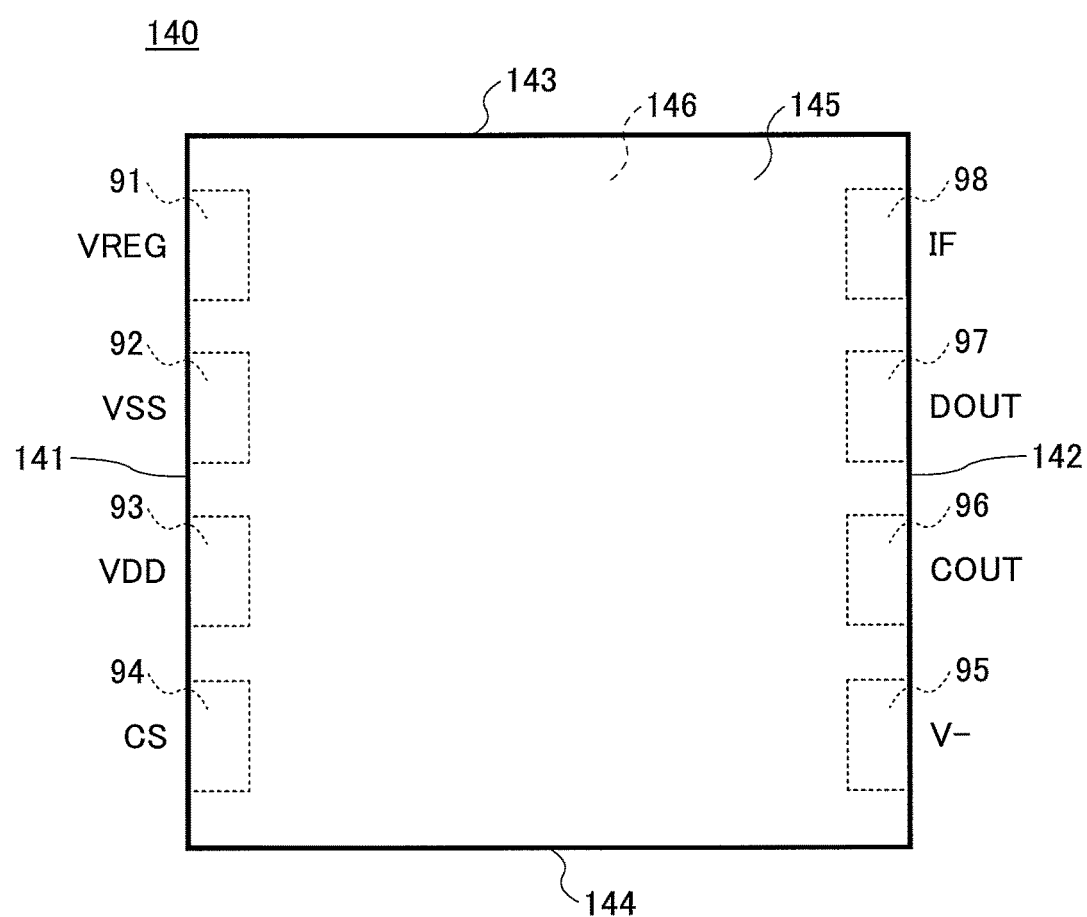
FIG. 4 is a plan view illustrating an example terminal arrangement of the multichip.

FIG. 4 is a plan view illustrating an example terminal arrangement of the multichip 140. The multichip 140 includes a package 145 that has a rectangular shape in the plan view and a plurality of external connection terminals 91-98. The package 145 is an example cover member for covering the protection IC 120, the monitoring IC 150, and the memory IC 170. The plurality of external connection terminals 91-98 are exposed on a terminal arrangement surface 146.

The terminal arrangement surface 146 faces an installation surface of a wiring substrate on which the multichip 140 is disposed. Also, the package 145 includes a first side 141, a second side 142 opposite the first side 141, a third side 143, and a fourth side 144 opposite the third side 143.

In the multichip 140, the terminals 91-94 are arranged, in that order, along the first side 141 of the terminal arrangement surface 146, and the terminals 95-98 are arranged, in that order, along the second side 142 of the terminal arrangement surface 146.

The terminals 91-94 may be wire leads extended from the first side 141 or from a bottom surface of the package 145, and the terminals 95-98 may be wire leads extended from the second side 142 or from a bottom surface of the package 145.

Figure 5:
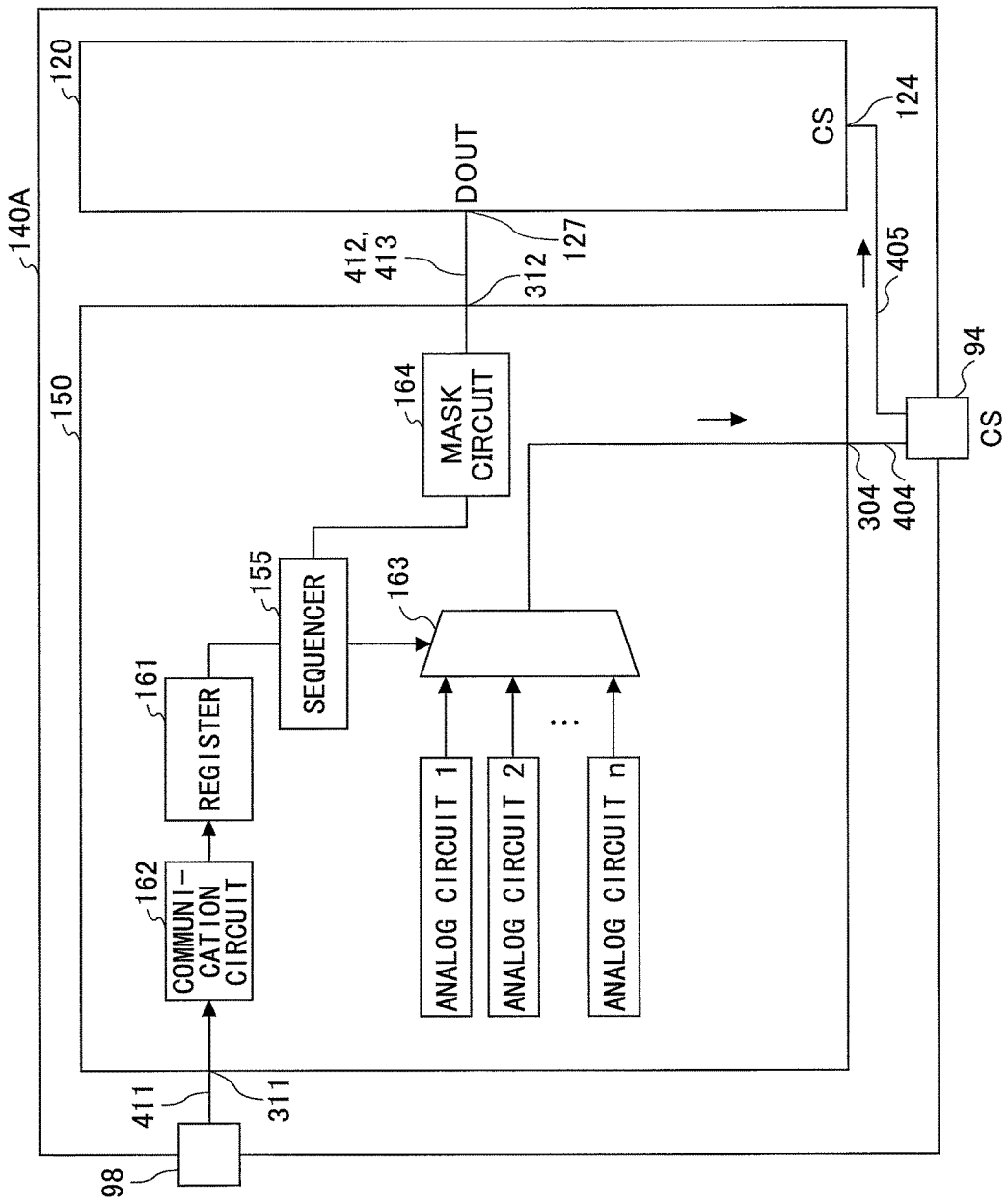
FIG. 5 is a diagram illustrating an example configuration of a multichip.

FIG. 5 is a diagram illustrating an example configuration of the multichip 140A. The multichip 140A is an example of the multichip 140 described above. The monitoring IC 150 includes a plurality of analog circuits 1-n, and a selection circuit 163. The oscillator 157, the temperature sensor 151, and the ADC 153 are exemplified as the analog circuits 1-n.

The selection circuit 163 is an example circuit for selectively switching connection destination of a plurality of nodes of the analog circuits 1-n into the current detection terminal 94 according to an instruction from the sequencer 155. That is, the plurality of nodes are selectively connected with the current detection terminal 94 in the switching operation of the selection circuit 163. The analog circuits 1-n are example internal circuits of the monitoring IC 150. An oscillation output node for outputting the oscillation signal of the oscillator 157, a sensor output node for outputting the sensor voltage signal of the temperature sensor 151, and an output node for outputting the digital output signal of the ADC 153 are exemplified as the plurality of nodes of the analog circuits 1-n.

When providing the selection circuit 163, a signal of an arbitrary analog circuit can be output from the current detection terminal 94 in a test mode operation. Meanwhile, the protection IC 120 can detect the overcurrent via the current detection terminal 94 in a normal mode operation. Therefore, a total number of external connection terminals can be suppressed even when an external connection terminal (in this case, current detection terminal 94), through which the internal nodes of the monitoring IC 150 can be accessed, is provided.

The monitoring IC 150 includes a first pad 304 coupled to the current detection terminal 94 via a first bonding wire 404. The protection IC 120 includes a second pad 124 coupled to the current detection terminal 94 via a second bonding wire 405. The selection circuit 163 selectively switches connection destination of a plurality of nodes in the analog circuit 1-n into the first pad 304.

The monitoring IC 150 includes a mask circuit 164 for invalidating the discharge control signal DOUT from the protection IC 120 input to the monitoring IC 150. The protection IC 120 may erroneously detect a signal at the current detection terminal 94 output from the analog circuit included in the monitoring IC 150 in the test mode operation, and may output the discharge control signal DOUT at low level. The mask circuit 164 prevents the sequencer 155 of the monitoring IC 150 from erroneously operating in accordance with the discharge control signal DOUT at low level output from the protection IC 120, which is input to the monitoring IC 150.

Figure 6:
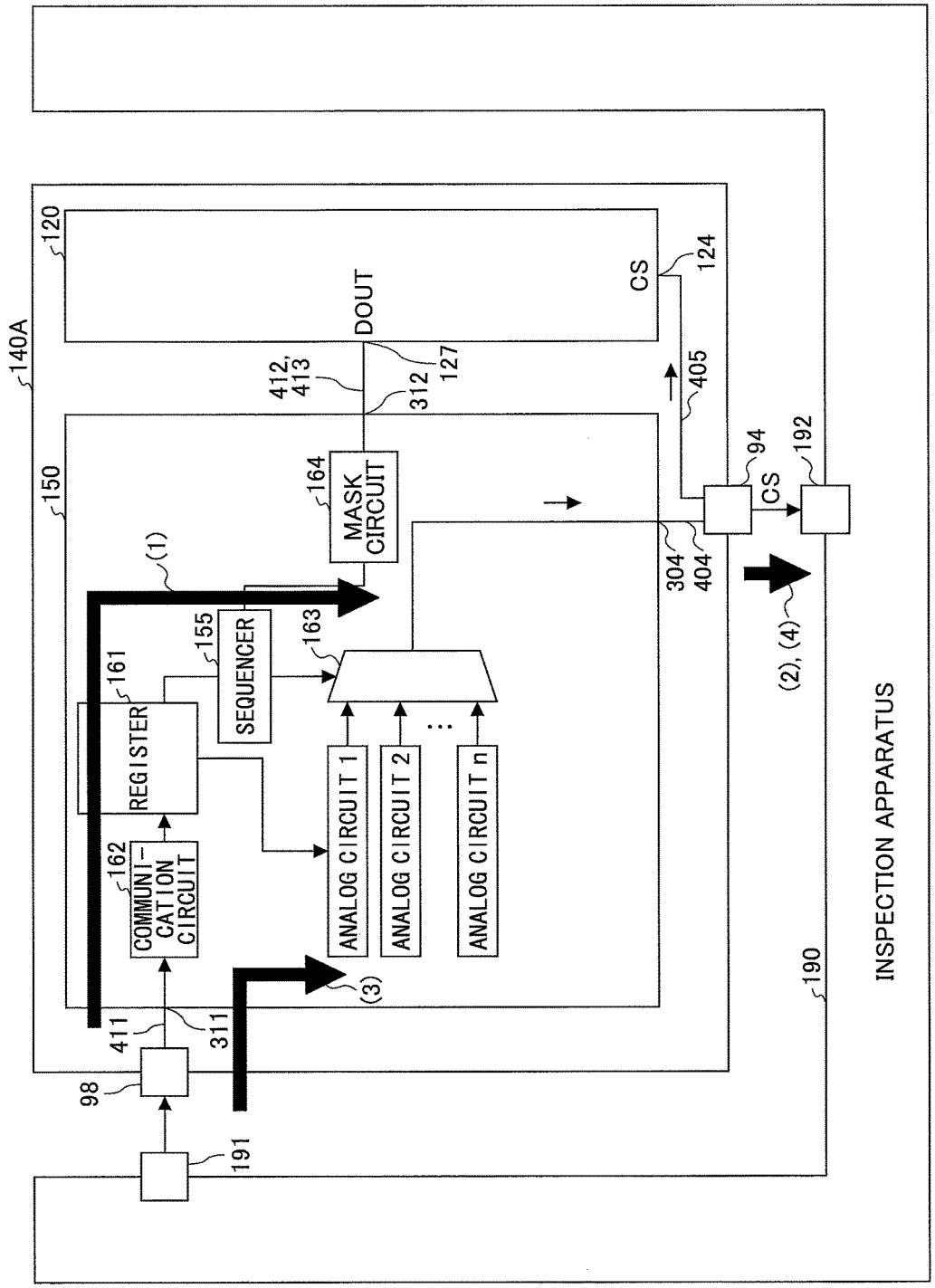
FIG. 6 is a diagram illustrating a trimming operation of an analog circuit in a monitoring IC.

FIG. 6 is a diagram illustrating a trimming operation of an analog circuit in the monitoring IC 150.

(1) An external inspection apparatus 190 transmits an instruction from an instruction terminal 191 to set the register 161 so that an output signal from an analog circuit to be corrected is output from the current detection terminal 94. The sequencer 155 controls the selecting operation of the selection circuit 163 in accordance with the set value of the register 161, thereby having the output signal of analog circuit to be corrected output from the current detection terminal 94.

(2) The external inspection apparatus 190 acquires a signal output at a monitoring terminal 192, where the signal is the output signal of analog circuit to be corrected output from the current detection terminal 94. The external inspection apparatus 190 calculates a correction value for adjusting the output signal of analog circuit to be corrected.

(3) The external inspection apparatus 190 writes the correction value calculated in (2) into memory elements in the register 161 so as to adjust the output signal of analog circuit to be corrected, thereby performing the adjustment of the output signal of analog circuit to be corrected.

(4) The external inspection apparatus 190 acquires the signal output at a monitoring terminal 192, where the signal is the output signal of analog circuit to be corrected output from the current detection terminal 94. The external inspection apparatus 190 checks the adjustment result of the output signal of analog circuit to be corrected.

Figure 7:
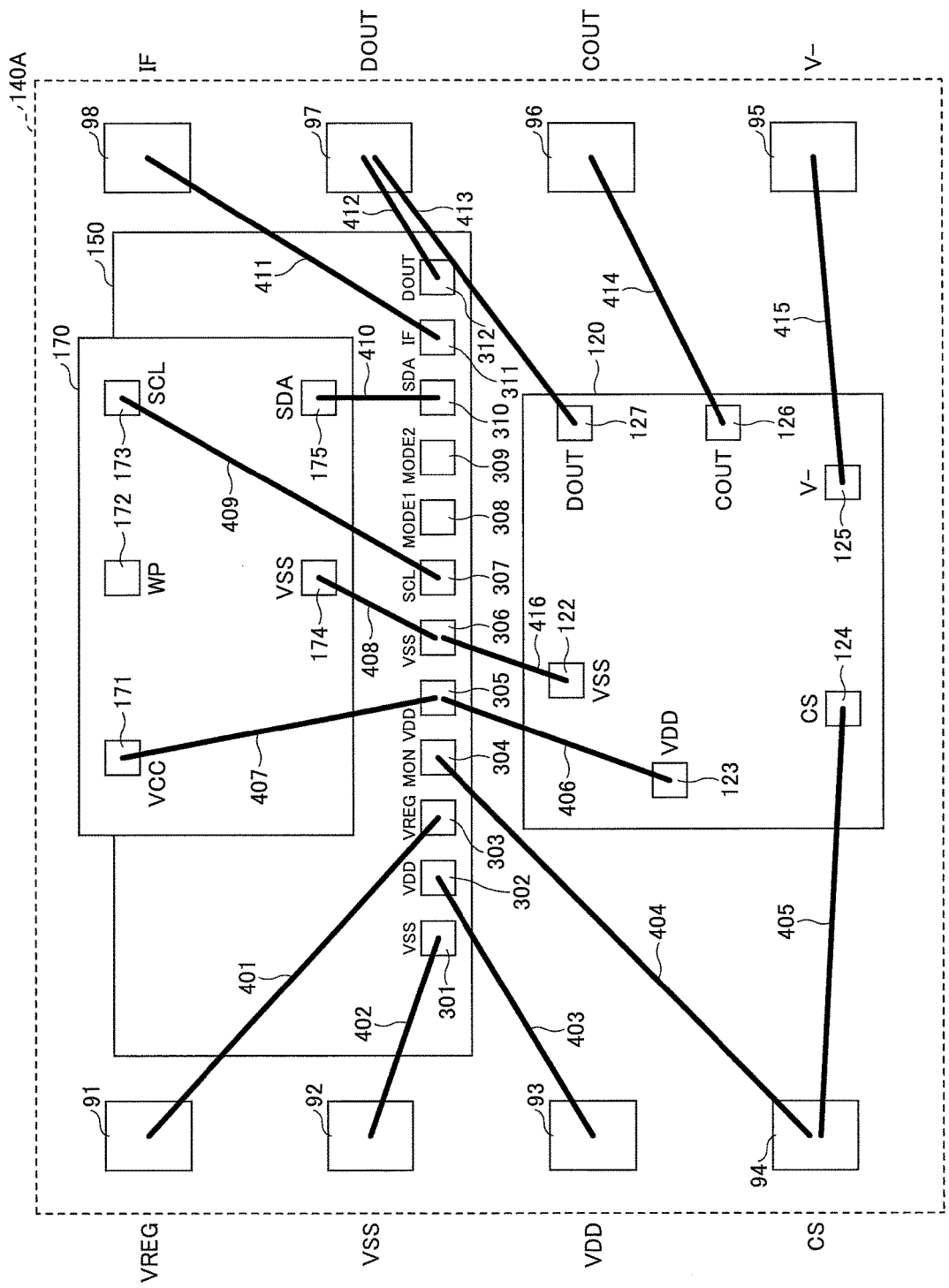
FIG. 7 is a plan view illustrating an example wire bonding in the multichip.

FIG. 7 is a plan view illustrating an example wire bonding in the multichip 140A, where the package 145 is removed in FIG. 7. The protection IC 120 and the monitoring IC 150 are arranged in a manner such that the protection IC 120 and the monitoring IC 150 are not overlapped in the plan view of the multichip 140A. The memory IC 170 may be disposed on the monitoring IC 150 in the multichip 140A.

The protection IC 120 includes six pads 122-127, the monitoring IC 150 includes twelve pads 301-312, and the memory IC 170 includes five pads 171-175. As illustrated in FIG. 7, respective pads are connected through bonding wires 401-415.

A pad 173 of the memory IC 170 and a pad 307 of the monitoring IC 150 are connected by a bonding wire 409 through which a serial clock SCL is transmitted. A pad 175 of the memory IC 170 and a pad 310 of the monitoring IC 150 are connected by a bonding wire 410 through which serial data SDA is transmitted. The memory IC 170 includes a pad 172 for write protect (WP), a pad 171 for power supply VCC, and a pad 174 for ground VSS.

The monitoring IC 150 includes a pad 304 with which the current detection terminal 94 is connected by a bonding wire 404. The pad 304 is a monitor pad MON for monitoring the internal circuits in the monitoring IC 150 by the external inspection apparatus 190 via the current detection terminal 94. The monitoring IC 150 may include mode setting pads MODE1 and MODE2 for setting an operation mode of the monitoring IC 150.

Figure 8:
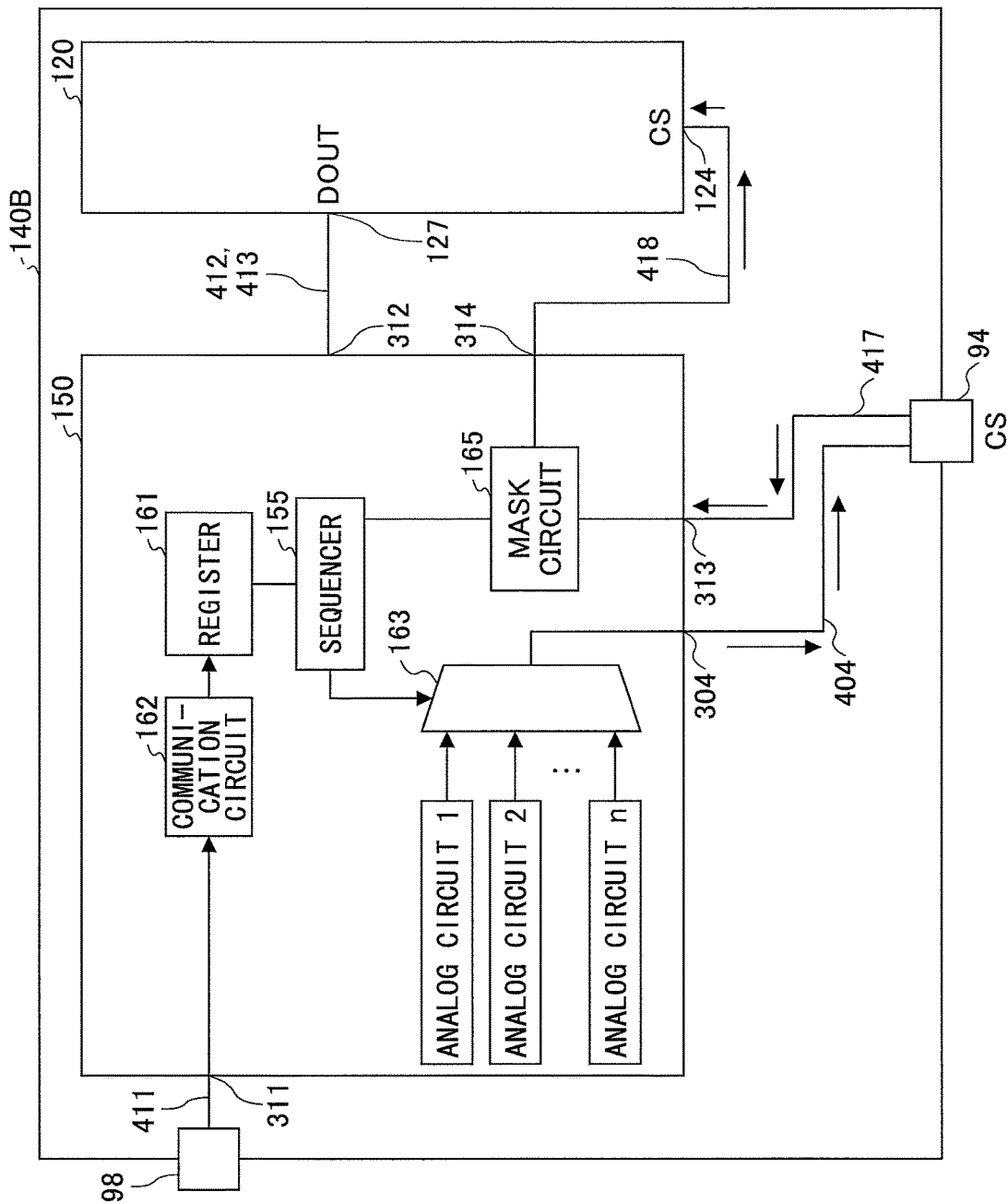
FIG. 8 is an example configuration of a multichip.

FIG. 8 is an example configuration of a multichip 140B. The multichip 140B is an example of the multichip 140 described above. In the configuration of the multichip 140B, portions similar to those of multichip 140A are not described here, since they are described with the multichip 140A.

When the selection circuit 163 is provided, a signal from an arbitrary circuit can be output at the current detection terminal 94 in the test mode operation. On the other hand, the protection IC 120 can detect the overcurrent based on the sense voltage input via the current detection terminal 94 and a mask circuit 165 in the normal mode operation. Therefore, a total number of external connection terminals can be suppressed even when an external connection terminal (in this case, current detection terminal 94), through which the internal nodes of the monitoring IC 150 can be accessed, is provided.

The monitoring IC 150 includes a first pad 304 that is connected with the current detection terminal 94 by a first bonding wire 404, a second pad 313 that is connected with the current detection terminal 94 by a second bonding wire 417, and a third pad 314 that is connected to the second pad 313 via a certain circuit. In FIG. 8, the certain circuit corresponds to the mask circuit 165. The protection IC 120 includes a fourth pad 124 that is connected with the third pad 314 by a third bonding wire 418. The selection circuit 163 selectively switches connection destinations of the analog circuits 1-n into the first pad 304.

The monitoring IC 150 includes a mask circuit 165 for invalidating the signal input from the current detection terminal 94 to the protection IC 120. The protection IC 120 may erroneously detect a signal at the current detection terminal 94 output from the analog circuit included in the monitoring IC 150 in the test mode operation, and may output the discharge control signal DOUT at low level. The mask circuit 165 invalidates the signal at the current detection terminal 94 input to the protection IC 120, thereby preventing the sequencer 155 from erroneously operating in accordance with the discharge control signal DOUT at low level output from the protection IC 120, which is input to the monitoring IC 150.

As described above, in the test mode operation, the mask circuit 165 can prevent the protection IC 120 from erroneously detecting the signal from the analog circuit in the monitoring IC 150 output at the current detection terminal 94 to be the sense voltage. Meanwhile, in the normal mode operation, the protection IC 120 can detect the overcurrent based on the sense voltage input at the current detection terminal 94.

Figure 9:
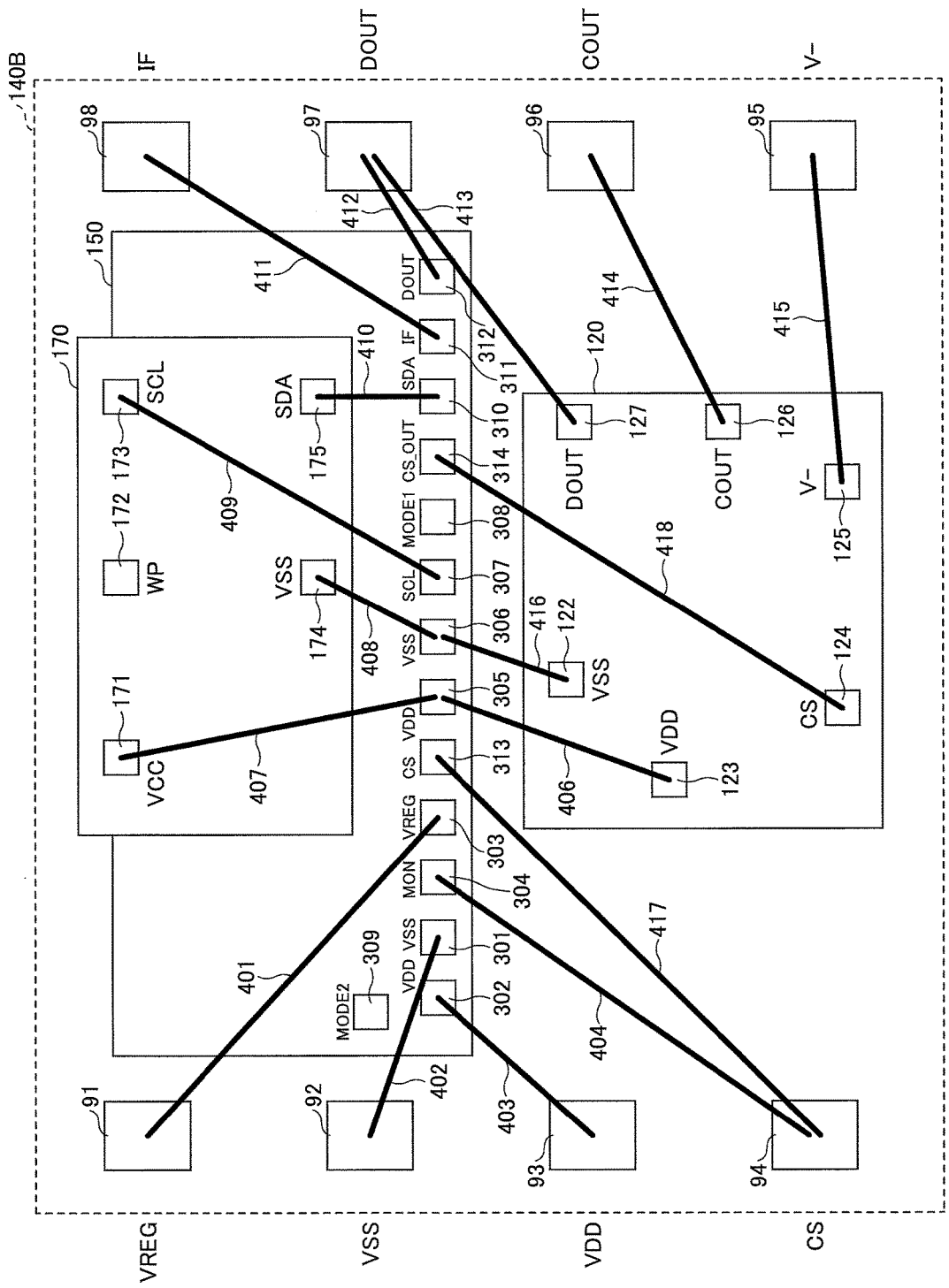
FIG. 9 is a plan view illustrating an example wire bonding of the multichip.

FIG. 9 is a plan view illustrating an example wire bonding of the multichip 140B, where the package 145 is removed in FIG. 9. The protection IC 120 includes six pads 122-127, the monitoring IC 150 includes thirteen pads 301-313, and the memory IC 170 includes five pads 171-175. As illustrated in FIG. 9, respective pads are connected through bonding wires 401-418.

A test monitor pad 304 and a current detection pad 313 of the monitoring IC 150 are connected with the current detection terminal 94. Also, a pad 314 of the monitoring IC 150 is connected with a pad 124 of the protection IC 120. The pad 314 is a pad CS_OUT for outputting a signal that has input to the current detection pad 313 via the current detection terminal 94 to a current detection pad 124 of the protection IC 120.

Figure 10:
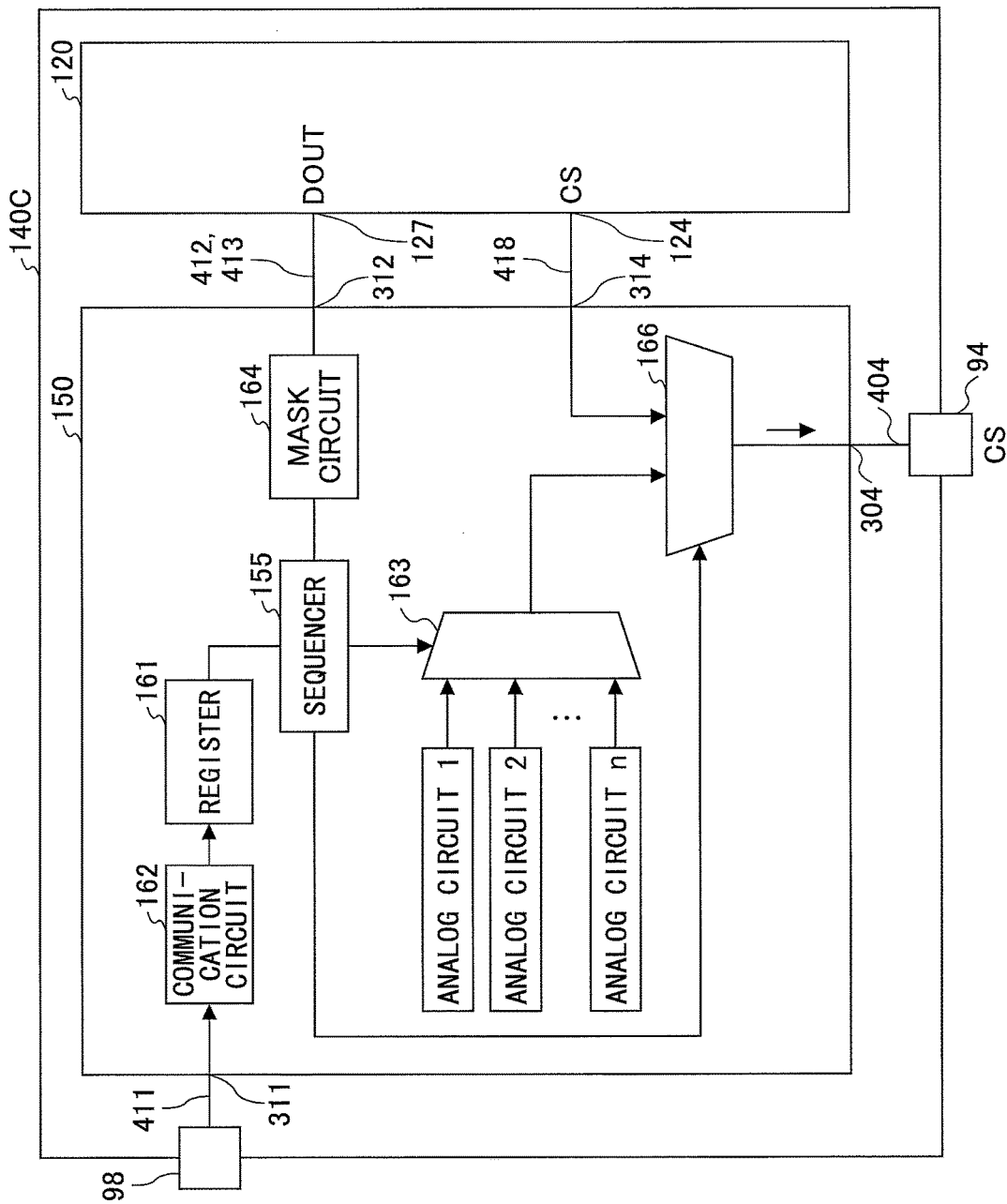
FIG. 10 is a diagram illustrating an example configuration of a multichip.

FIG. 10 is a diagram illustrating an example configuration of a multichip 140C. The multichip 140C is an example of the multichip 140 described above. In the configuration of the multichip 140C, portions similar to those of multichips 140A and 140B are not described here, since they are described with the multichips 140A and 140B.

The monitoring IC 150 includes a first pad 304 that is connected with the current detection terminal 94 by a first bonding wire 404. The selection circuit 163 is an example of first switching unit for selectively switching connection destinations of a plurality of nodes of analog circuits 1-n into a selection circuit 166 in accordance with an instruction of the sequencer 155. The selection circuit 166 is an example of second switching unit for selectively switching connection destinations of the selection circuit 163 and a connection destination of the pad 124 of the protection IC 120 into the first pad 304 in accordance with the instruction of the sequencer 155.

When the selection circuits 163 and 166 are provided, a signal from an arbitrary analog circuit can be output at the current detection terminal 94 in the test mode operation. Meanwhile, the protection IC 120 can detect the overcurrent based on the sense voltage input via the current detection terminal 94 and the selection circuit 166 in the normal mode operation. Therefore, a total number of external connection terminals can be suppressed even when an external connection terminal (in this case, current detection terminal 94), through which the internal nodes of the monitoring IC 150 can be accessed, is provided.

Figure 11:
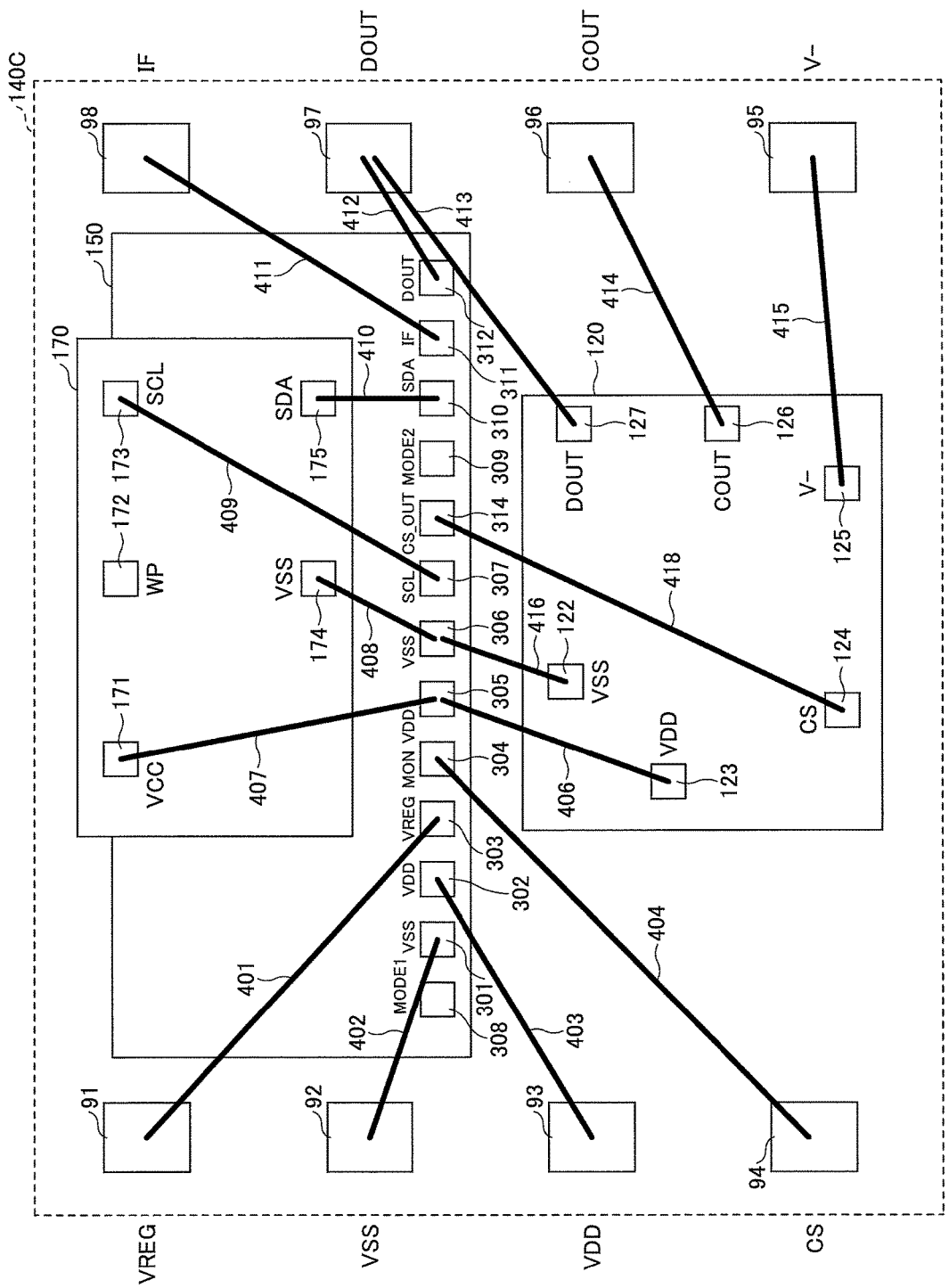
FIG. 11 is a plan view illustrating an example wire bonding of the multichip.

FIG. 11 is a plan view illustrating an example wire bonding of the multichip 140C, where the package 145 is removed in FIG. 11. The protection IC 120 includes six pads 122-127, the monitoring IC 150 includes twelve pads 301-312, the memory IC 170 includes five pads 171-175. As illustrated in FIG. 11, respective pads are connected through bonding wires 401-418.

The current detection terminal 94 is connected with a test monitoring pad 304 of the monitoring IC 150. A monitor output pad 314 is connected with a current detection pad 124 of the protection IC 120.

Herein above, although the multichip, the battery protection apparatus, and the battery pack have been described with respect to specific embodiments, the appended claims are not to be thus limited. It should be understood that the various changes, substitutions, and alterations could be made hereto without departing from the spirit and scope of the claims. Further, all or part of the components of the embodiments described above can be combined.

For example, an external connection terminal through which the internal nodes of the monitoring IC 150 can be accessed from outside of the package is not limited to the current detection terminal 94. The external connection terminal may be the overcurrent detection terminal 95. For example, in FIG. 5, the selection circuit 163 may selectively switch the connection destinations of a plurality of nodes in the analog circuits 1-n into the overcurrent detection terminal 95 in accordance with an instruction from the sequencer 155.

What is claimed is:

1. A multichip in which a protection IC for detecting at least one of overcharge, over discharge, and overcurrent of a secondary battery and a monitoring IC for monitoring a battery state of the secondary battery are integrated in a package, wherein
the protection IC and the monitoring IC are disposed in a manner such that the protection IC and the monitoring IC are not overlapped in a plan view,
the package is formed in a rectangular shape including a first side and a second side opposite the first side,
a regulator output terminal for the monitoring IC, a ground terminal common to the protection IC and the monitoring IC, a power supply terminal common to the protection IC and the monitoring IC, and a current detection terminal for the protection IC are disposed along a first side of the package, and
a communication terminal for the monitoring IC, a discharge control terminal for the protection IC, a charge control terminal for the protection IC, and a overcurrent detection terminal for the protection IC are disposed as external connection terminals along the second side of the package,
the protection IC comprising:
a charge control circuit configured to output a charge control signal at the charge control terminal based on at least one of a voltage between the power supply terminal and the ground terminal and a voltage between the current detection terminal and the ground terminal, a charge operation of the secondary battery being prevented by the charge control signal; and
a discharge control circuit configured to output a discharge control signal at the discharge control terminal based on at least one of the voltage between the power supply terminal and the ground terminal and the voltage between the overcurrent detection terminal and the ground terminal, a discharge operation of the secondary battery being prevented by the discharge control signal;
the monitoring IC comprising:
a measuring circuit configured to measure at least one of a voltage of the secondary battery and a temperature of the monitoring IC;
a communication circuit configured to transmit a measuring result of the measuring circuit via the communication terminal;
a regulator outputting a voltage at the regulator terminal; and wherein
the multichip comprises a selection circuit configured to perform a switching operation in which a plurality of nodes included in the monitoring IC are electively connected with the current detection terminal.

2. The multichip according to claim 1, wherein
the monitoring IC includes a first pad that is connected with the current detection terminal via a first bonding wire,
the protection IC includes a second pad that is connected with the current detection terminal via a second bonding wire, and
in the switching operation of the selection circuit, the plurality of nodes are selectively connected with the first pad.

3. The multichip according to claim 1, wherein
the monitoring IC includes a first pad that is connected with the current detection terminal via a first bonding wire, and a second pad that is connected with the current detection terminal via a second bonding wire, and a third pad that is connected with the second pad via a certain circuit,
the protection IC includes a fourth pad that is connected with the third pad via a third bonding wire, and
in the switching operation of the selection circuit, the plurality of nodes are electively connected with the first pad.

4. The multichip according to claim 1, wherein
the monitoring IC includes a first pad that is connected with the current detection terminal via a first bonding wire,
the selection circuit includes a first switching unit and a second switching unit,
in the switching operation performed by the first switching unit of the selection circuit, the plurality of nodes are electively connected with the second switching unit, and
in the switching operation performed by the second switching unit of the selection circuit, the first switching unit and the plurality of nodes are selectively connected with the first pad.

5. The multichip according to claim 1, wherein signals are respectively output from the nodes.

6. A battery protection apparatus comprising:
a multichip according to claim 1 and a switch circuit; wherein
the switch circuit includes a charge control transistor that prevents charge operation of the secondary battery in accordance with the charge control signal and a discharge control transistor that prevents discharge operation of the secondary battery in accordance with the discharge control signal.

7. A battery pack comprising a battery protection apparatus according to claim 6 and the secondary battery.

8. A multichip in which a protection IC for detecting at least one of overcharge, over discharge, and overcurrent of a secondary battery and a monitoring IC for monitoring a battery state of the secondary battery are integrated in a package, wherein
the protection IC and the monitoring IC are disposed in a manner such that the protection IC and the monitoring IC are not overlapped in a plan view,
the package is formed in a rectangular shape including a first side and a second side opposite the first side,
a regulator output terminal for the monitoring IC, a ground terminal common to the protection IC and the monitoring IC, a power supply terminal common to the protection IC and the monitoring IC, and a current detection terminal for the protection IC are disposed along a first side of the package, and
a communication terminal for the monitoring IC, a discharge control terminal for the protection IC, a charge control terminal for the protection IC, and a overcurrent detection terminal for the protection IC are disposed as external connection terminals along the second side of the package,
the monitoring IC comprising:
a charge control circuit configured to output a charge control signal at the charge control terminal based on at least one of a voltage between the power supply terminal and the ground terminal and a voltage between the current detection terminal and the ground terminal, a charge operation of the secondary battery being prevented by the charge control signal; and
a discharge control circuit configured to output a discharge control signal at the discharge control terminal based on at least one of the voltage between the power supply terminal and the ground terminal and the voltage between the overcurrent detection terminal and the ground terminal, a discharge operation of the secondary battery being prevented by the discharge control signal;
the monitoring IC comprising:
a measuring circuit configured to measure at least one of a voltage of the secondary battery and a temperature of the monitoring IC;
a communication circuit configured to transmit a measuring result of the measuring circuit via the communication terminal;
a regulator outputting a voltage at the regulator terminal; and wherein
the multichip comprises a selection circuit configured to perform a switching operation in which a plurality of nodes included in the monitoring IC are electively connected with the overcurrent detection terminal.

9. The multichip according to claim 8, wherein signals are respectively output from the nodes.

10. A battery protection apparatus comprising:
a multichip according to claim 8 and a switch circuit; wherein
the switch circuit includes a charge control transistor that prevents charge operation of the secondary battery in accordance with the charge control signal and a discharge control transistor that prevents discharge operation of the secondary battery in accordance with the discharge control signal.

11. A battery pack comprising a battery protection apparatus according to claim 10 and the secondary battery.

* * * * *